(12) United States Patent
Shioya et al.

(10) Patent No.: US 7,608,877 B2
(45) Date of Patent: Oct. 27, 2009

(54) CIRCUIT DEVICE HAVING CAPACITOR AND FIELD EFFECT TRANSISTOR, AND DISPLAY APPARATUS THEREWITH

(75) Inventors: Shunsuke Shioya, Abiko (JP); Sotomitsu Ikeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/555,943

(22) Filed: Nov. 2, 2006

(65) Prior Publication Data

US 2007/0126044 A1 Jun. 7, 2007

(30) Foreign Application Priority Data

Dec. 6, 2005 (JP) .............................. 2005-352572

(51) Int. Cl.
*H01L 29/772* (2006.01)
(52) U.S. Cl. .................. 257/296; 257/532; 257/E51.04
(58) Field of Classification Search ...................... 257/9, 257/12, 14, 15, 20, 296–313, 528, 532, E51.001, 257/E51.024, E51.038, E51.04
See application file for complete search history.

(56) References Cited

U.S. PATENT DOCUMENTS 6,515,325 B1 * 2/2003 Farnworth et al. .......... 257/296

| 2004/0112964 | A1 | 6/2004 | Empedocles et al. |
| 2005/0064185 | A1 | 3/2005 | Buretea et al. |
| 2005/0276093 | A1 * | 12/2005 | Graham et al. ............... 365/149 |
| 2006/0244361 | A1 * | 11/2006 | Kim et al. .................... 313/495 |

FOREIGN PATENT DOCUMENTS

JP 2004-146520 5/2004

OTHER PUBLICATIONS

X. Duan et al., High-performance thin-film transistors using semiconductor nanowires and nanoribbons, Nature, Sep. 18, 2003, 274—278, Vol. 425, Nature Publishing Group, England.

* cited by examiner

*Primary Examiner*—Sue Purvis
*Assistant Examiner*—Kevin Quinto
(74) *Attorney, Agent, or Firm*—Canon U.S.A., Inc., IP Division

(57) ABSTRACT

In a circuit device having a field effect transistor and a capacitor, the capacitor is connected to at least one of a gate electrode, a source electrode and a drain electrode of a field effect transistor, the field effect transistor has a channel comprised of a first nano-wire, and the capacitor comprises a first electrode comprised of a second nano-wire having electroconductivity, a dielectric layer partly covering the peripheral face of the first electrode and a second electrode covering the peripheral face of the dielectric layer.

9 Claims, 10 Drawing Sheets

CIRCUIT DEVICE HAVING CAPACITOR AND FIELD EFFECT TRANSISTOR, AND DISPLAY APPARATUS THEREWITH

BACKGROUND OF THE INVENTION

1. Field of the Invention

The present invention relates to a circuit device having a field effect transistor employing a nano-wire as a channel, and a capacitor employing a nano-wire. The present invention relates also to a display apparatus employing the circuit device.

2. Description of the Related Art

Recently, with progress of fine working techniques for LSI, remarkable progress is being made in improvement of CPU calculation speed, increase of semiconductor memory capacity, and miniaturization of electric devices. However, the patterning of the LSI is conducted by a top-down method including light exposure, the working accuracy thereof being limited to several tens of nanometers. Although scanning tunnel microscopy (STM) and atomic force microscopy (AFM) are useful for forming a several-nanometer structure, the techniques are not readily applicable to a larger-area structure. Therefore, a novel technique is necessary for higher integration of electronic circuits.

For solving the above problem, one method disclosed is use of nano-wires for the electronic circuit. The nano-wire is produced mainly by a bottom-up method. The nano-wire is expected to provide a circuit at a density higher by one or more digits than that of conventional circuits provided by the top-down method. Since the size of several nano-meters is expected to give a novel effect like the quantum effect, the nano-wire has a possibility of providing, for example, a revolutionary novel device such as a super-high speed switching element utilizing the nonlinear optical characteristics given by the quantum effect. Herein, the term "top-down method" is a general term for fine-processing techniques of processing a bulky material to make a product of smaller size. The term "bottom-up method" means a fine-assembling method in which such a smaller substance as the nano-wire is generated and then enlarged.

The nano-wire research includes an FET technique employing a semiconductor nano-wire. The semiconductor nano-wire FET (Field-Effect Transistor) employs a semiconductor nano-wire having high mobility of several-hundred to several-thousand $cm^2/Vs$ as the conduction channel, and is promising for finer circuits (e.g., Patent Document 1).

The above-mentioned semiconductor nano-wire FETs can be formed by applying a dispersion of the semiconductor nano-wires in a solution on a substrate (e.g., Non-Patent Document 1: X. Duan et al., Nature, 425 (2003) 274). This technique enables formation of a TFT (thin film transistor) of high performance in a large area at a low cost on a desired substrate. Further, the semiconductor nano-wire FET can be formed on a plastic substrate to provide a flexible high-performance TFT, which is applicable as RF-ID (radio frequency identification), a flexible display, a sheet computer, and so forth.

Figure 19:
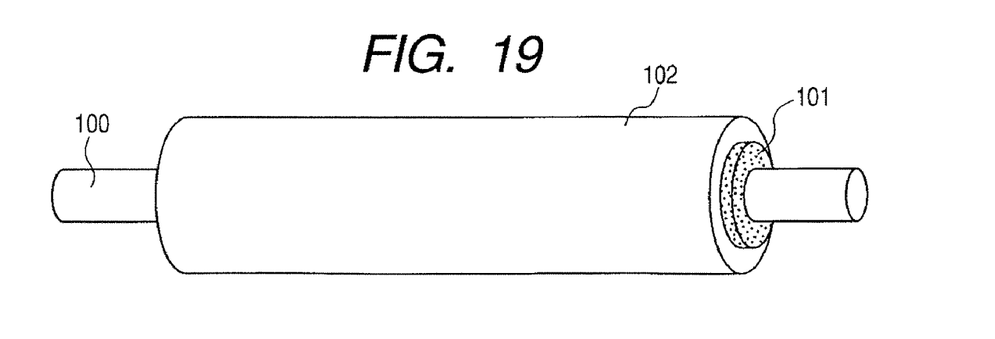
FIG. 19 illustrates a constitution of a semiconductor nano-wire employed in a semiconductor nano-wire.

Patent Document 1 (US Patent Application Laid-Open No. 2004/0112964) discloses an FET which employs semiconductor nano-wire 100 covered with dielectric layer 101 and gate electrode 102, as shown in FIG. 19. By use of the nano-wire having the above constitution in an FET, the gate electrode need not be provided additionally and the drop of the threshold level by overlapping of the nano-wires can be prevented. Thereby, a semiconductor nano-wire transistor of high performance is provided through a simple process in comparison with the one having a separate gate electrode.

SUMMARY OF THE INVENTION

However, in the circuit device employing the nano-wire FETs, a capacitor may be actually necessary. The inventors of the present invention noticed that, in such a circuit device, miniaturization of the circuit is limited by the size of the capacitor.

Naturally, even if a capacitor in a nano-meter scale can be formed by light exposure and development by photolithography, the capacitance of a conventional capacitor having flat electrodes and a dielectric material sandwiched therebetween becomes smaller.

To solve the problem, the inventors of the present invention have prepared a capacitor by use of a nano-wire.

The present invention provides a circuit device having a field effect transistor employing a nano-wire, and a capacitor employing a nano-wire. The present invention provides also a novel display apparatus employing the circuit device.

According to an aspect of the present invention, there is provided a circuit device having a field effect transistor and a capacitor, wherein the capacitor is connected to at least one of a gate electrode, a source electrode and a drain electrode of a field effect transistor, the field effect transistor has a channel comprised of a first nano-wire, and the capacitor comprises a first electrode comprised of a second nano-wire having electroconductivity, a dielectric layer partly covering the peripheral face of the first electrode and a second electrode covering the peripheral face of the dielectric layer.

The first electrode preferably has a first end portion and a second end portion, and, the dielectric layer preferably covers the first end portion and the peripheral face of the first electrode between the first end portion and the second end portion, but not covering the second end portion.

In the circuit device, peripheral face of the first electrode is preferably covered with the dielectric layer and the second electrode one by one, or with dielectric layers and second electrodes alternately in lamination.

The one end portion of the first electrode is preferably not covered with the dielectric layer and the second electrode to be bared.

In the circuit device, a first length direction of the first nano-wire comprising the channel of the field effect transistors and a second length direction of the second nano-wire comprising the capacitor are preferably oriented in the same direction.

In the circuit device, a portion of the first nano-wire preferably serves as the first electrode comprising the capacitor.

According to another aspect of the present invention, there is provided a display apparatus, comprising the above circuit device, and a display element connected to the source electrode or the drain electrode of the field effect transistor of the circuit device.

The display element is preferably an organic light-emitting element.

According to a still another aspect of the present invention, there is provided a Circuit device having a field effect transistor and a capacitor, wherein the capacitor is connected to at least one of a gate electrode, a source electrode and a drain electrode of a field effect transistor, the field effect transistor has a channel comprised of a first nano-wire, the capacitor comprises a first electrode comprised of a second nano-wire having electroconductivity, a dielectric layer covering the peripheral face of the first electrode and a second electrode covering the peripheral face of the dielectric layer, and longitudinal directions of the first nano-wire and the second nano-wire are the same.

Further features of the present invention will become apparent from the following description of exemplary embodiments with reference to the attached drawings.

DESCRIPTION OF THE EMBODIMENTS

Embodiments of the present invention are explained below in detail by reference to drawings.

First Embodiment

Circuit Device

Figure 1:
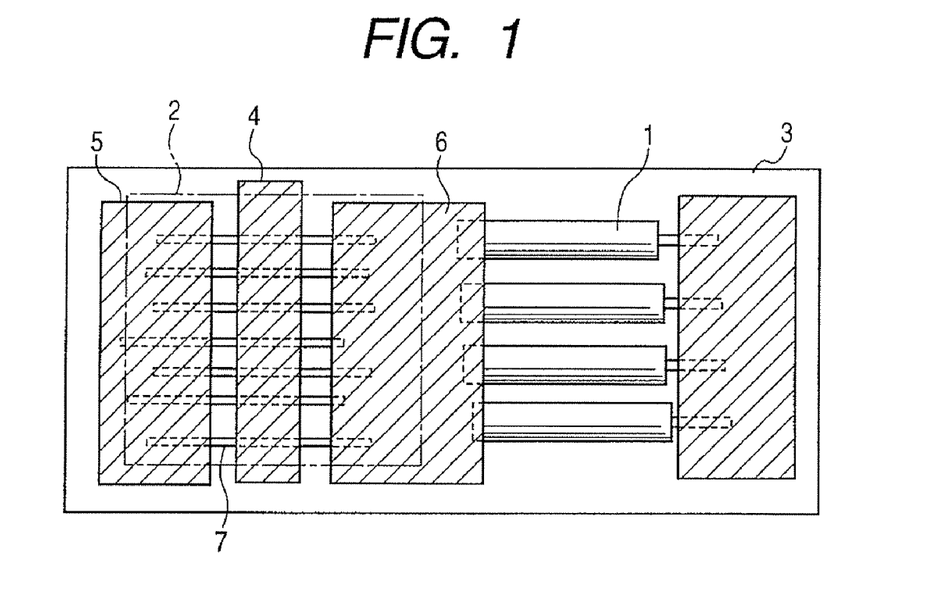
FIG. 1 illustrates an example of the electric element of the present invention.

FIG. 1 illustrates a circuit device of the present invention, in which capacitors 1 containing a nano-wire and nano-wire transistor 2 containing semiconductor nano-wires are connected in series. The nano-wire transistor comprises gate electrode 4, source electrode 5, drain electrode 6, and semiconductor nano-wire 7.

The circuit of the above constitution is similar to one cell of a DRAM, and is useful in the DRAM.

Nano-wire capacitor 1 is comprised of core electrode (first electrode) 8, dielectric layer 9, and surface electrode (second electrode) 10. Electroconductive second nano-wire 8 serves as the first electrode having first end portion 3010 and second end portion 3020. Second nano-wire 8 is covered with dielectric layer 9 at end portion 3010 and at the peripheral portion from the first end portion 3010 toward the second end portion 3020 but is not covered at the second end portion. The peripheral face of dielectric layer 9 is covered further with second electrode 10.

Figure 3A:
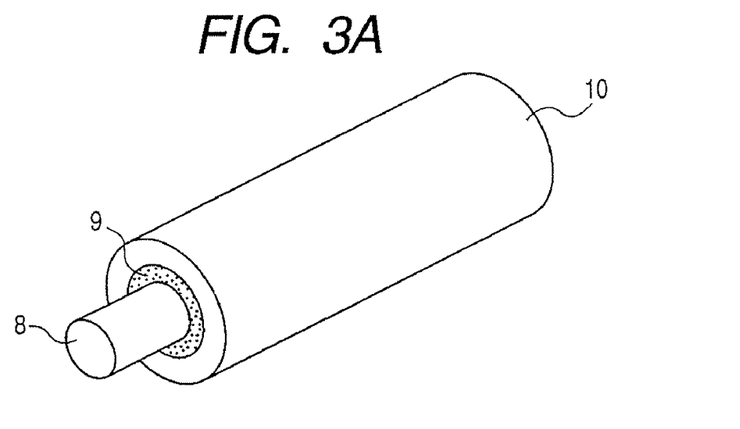
FIG. 3A is a perspective view of a nano-wire capacitor of the present invention.
Figure 3B:
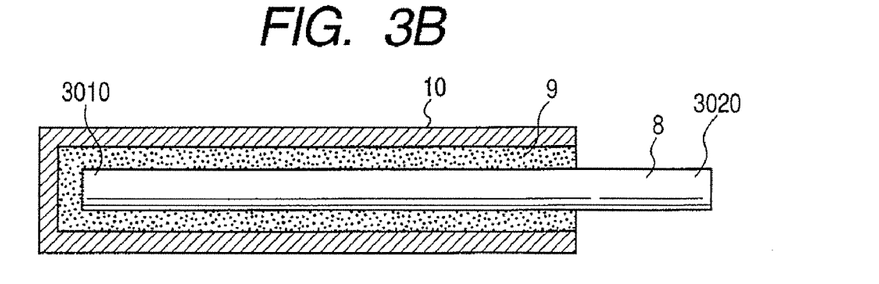
FIG. 3B is a sectional view thereof.
Figure 8:
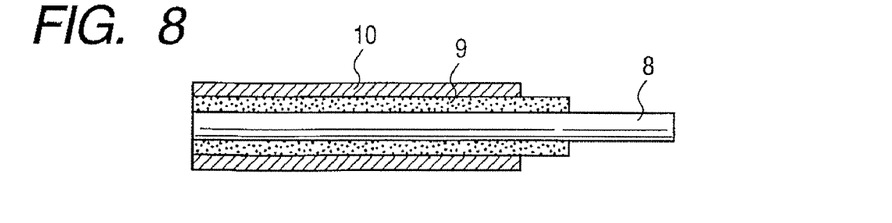
FIG. 8 is a sectional view of still another nano-wire capacitor employed in the present invention.

In FIGS. 3A and 3B, the end face of first end portion 3010 is covered with dielectric layer 9. However, the end face need not be covered by dielectric layer 9, for example as shown in FIG. 8. In the case where second end portion 3020 of first electrode 8 is not covered with dielectric layer 9, the bared portion may be covered with another material, insofar as first electrode 8 and second electrode 10 are electrically kept insulated.

Figure 6:
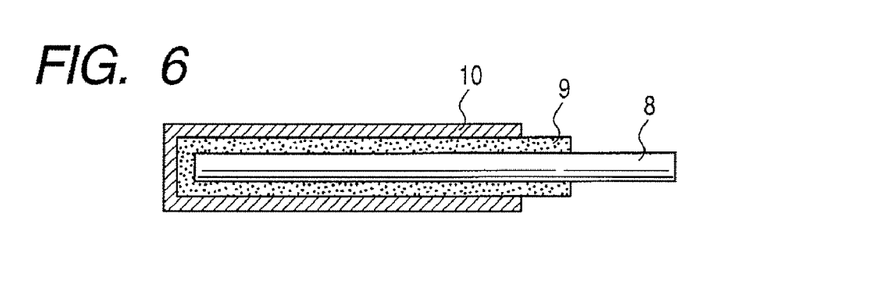
FIG. 6 is a sectional view of a nano-wire capacitor employed in the present invention.

In this embodiment, dielectric layer 9 covers the peripheral face of first electrode 8 in a state as follows: (1) the dielectric layer covers the peripheral face except the bared portion of core electrode (first electrode) 8, and covers the end face at the other side opposite to the bared portion as shown in FIG. 3B, and FIG. 6; or (2) the dielectric layer covers the peripheral face except the bared portion of core electrode (first electrode) 8, but does not cover the end face at the other side opposite to the bared portion as shown in FIG. 8.

The nano-wire capacitor portion may be comprised of the first electrode comprised of a conductive nano-wire, the dielectric layer covering partly the peripheral face of the first electrode and the second electrode covering the peripheral face of the dielectric layer. The region of the first electrode not covered with the dielectric layer may consist of either one tip of the first electrode or such an intermediate part in the direction of longitudinal direction of the electrode.

The circuit device and electric element of the present invention comprise the semiconductor nano-wire FET and the nano-wire capacitor at least in the circuit. Therefore, the TFT and the capacitor can be formed on the element by applying a dispersion of the semiconductor nano-wire or the nano-wire capacitor in a solvent by coating application. Thereby, the element can be formed on a desired substrate, in a larger area at a lower cost. The element can be made flexible by formation on a plastic substrate. In particular, the semiconductor nano-wire TFT, which has high mobility, can achieve performance not lower than the one produced by a conventional vacuum process. The circuit device and electric element of the present invention is useful in a circuit containing a conventional capacitor other than the nano-wire capacitor: for example, in a circuit containing a liquid crystal or a like capacitor component.

Further, according to the present invention, a nano-meter-sized TFTs and capacitors can be formed without employing a conventional light exposure process, which facilitates miniaturization of the electronic circuit. The nano-wire capacitor has a shape of a column or a needle, which enables a high capacity of the capacitor in comparison with a planar capacitor occupying the same area.

The conditions for increase of the capacitance are explained below, by taking a cylindrical capacitor as an example. For simplicity of description, a cylindrical capacitor is explained below, but the nano-wire capacitor of the present invention is not limited to the cylindrical capacitor. Depending on the process and material, the nano-wire can have a shape of a polygonal column or a needle. Such a nano-wire also can give a capacitor having a higher capacitance than a parallel-plate capacitor.

The capacitance ($C_{pl}$) of a parallel-plate capacitor is represented by Equation 1 below:

$$C_{pl} = \in S/d \tag{1}$$

where $\in$ denotes the dielectric constant of the dielectric layer, S denotes the area of the electrode, and d denotes the distance between the electrodes.

On the other hand, the capacitance ($C_{cyl}$) of a cylindrical condenser is represented by Equation 2 below:

$$C_{cyl} = 2\pi \in \cdot L/\ln(b/a) \tag{2}$$

where a denotes the radius of the core electrode, b denotes the distance from the core center axis to the surface electrode, ø denotes the dielectric constant of the dielectric layer, and L denotes the length of the dielectric layer.

Therefore, the condition for $C_r = C_{cyl}/C_{pl} > 1$ is represented by Equation 3 below:

$$C_r = [(2\pi L)/\ln(b/a)](d/S) \tag{3}$$

When the cylindrical nano-wire capacitor and the parallel-plate capacitor have respectively a dielectric layer of the same thickness (thickness d=b−a), and have the same occupation area on the substrate (major axis: L, minor axis: b), the above Equation 3 is transformed as below:

$$C_r = 2\pi(1-a/b)/\ln(b/a)b/a > 1 \tag{4}$$

Figure 2:
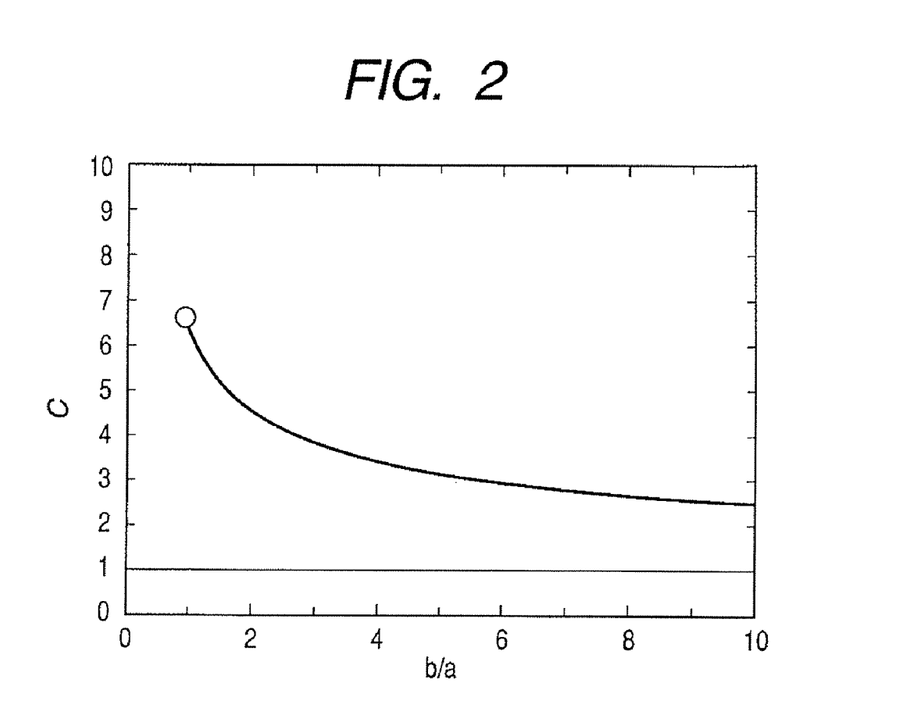
FIG. 2 is a graph showing dependence of the ratio of the capacitance of a cylindrical capacitor to the capacitance of a plate capacitor on the ratio of the major axis to the minor axis of a cylindrical nano-wire capacitor.

FIG. 2 shows plots according to Equation 4, taking the ratio (b/a) on the abscissa. In the present invention, the cylindrical nano-wire capacitor has a ratio of b/a ranging from about 1.5 to about 3, therefore giving a capacitance higher by a factor of 4 or more than that of a parallel-plate type of capacitor.

In the circuit device and an electric element containing a semiconductor nano-wire transistor or transistors and a capacitor or capacitors, at least one of the capacitor is a nano-wire capacitor. The nano-wire capacitor may be comprised, for higher capacitance, of an electroconductive nano-wire as a first electrode; a first dielectric layer and a second electrode layer laminated one by one or two or more of the first dielectric layers and the second dielectric layers laminated alternately with the first electrode partly bared; and a third electrode formed on the peripheral face of the second electrode with interposition of the second dielectric layer.

Figure 21:
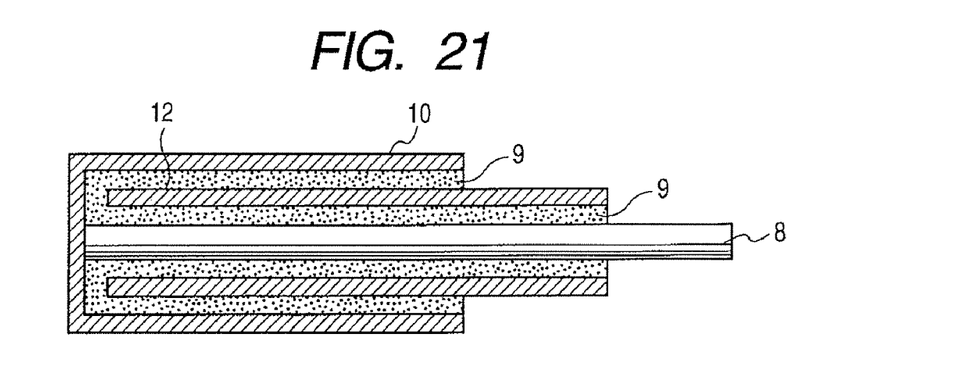
FIG. 21 is a sectional view of a nano-wire capacitor employed in the present invention.
Figure 22:
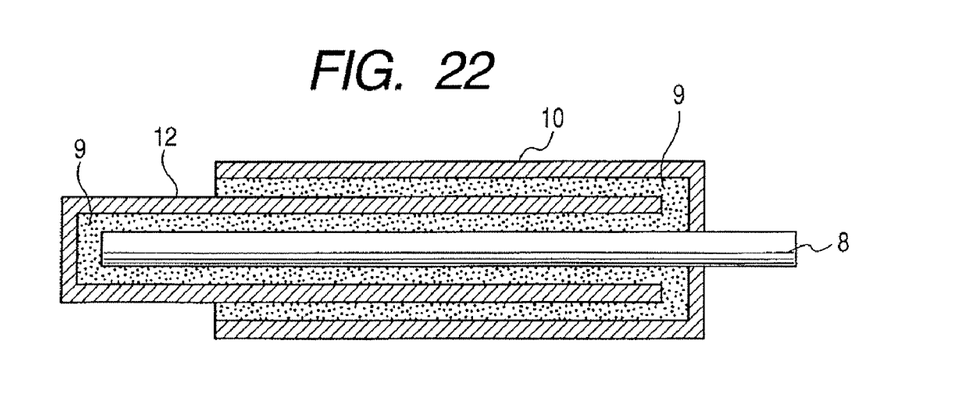
FIG. 22 is a sectional view of another nano-wire capacitor employed in the present invention.

With the above-mentioned nano-wire capacitor, plural capacitors can be formed in parallel on a single nano-wire to increase the capacitance of the nano-wire capacitor for increase of charge storage. Further, by connection of the first electrode with the third electrode as shown in FIGS. 21 and 22, the electrode area is increased for providing a higher capacitance of the nano-wire capacitor.

With the circuit device and an electric element of the present invention, a display apparatus can be provided. In an active-drive type display apparatus, since respective picture elements should have memorizing ability, capacitors are provided in the TFT circuit. In comprising the display apparatus of the present invention, nano-wire transistors and nano-wire capacitors can be formed without employing a vacuum process on a desired substrate. Thereby a larger screen and a lower production cost are achievable. The display apparatus can be made flexible by use of a plastic substrate.

The display element of the display apparatus may be an organic electric field luminescence (EL) display element. With a conventional organic EL display apparatus, a TFT of a large display area with high mobility cannot be produced. However, the semiconductor nano-wire transistor of the present invention solves the above problem, and enables production of an organic EL display apparatus with a large display area and a high mobility.

The circuit device and electric element of the present invention are useful for comprising a memory storage element. The semiconductor nano-wire and the nano-wire capacitor mentioned above have a diameter of tens of nanometers or smaller. Therefore, use of the circuit devices and electric elements of the present invention as the memory storage elements enables a high density of the circuits and increased memory capacity in comparison with conventional circuits produced by a light exposure process. Further, in production of the memory storage elements, the transistors and the capacitors can be formed on a desired substrate by a coating application without employing a vacuum process. Thereby, the production cost can be reduced, and the area of the elements can be enlarged, which enables formation of a memory storage device having a high density and a large area, and large capacity which has not been achieved until now. This memory storage device will be useful for new application fields such as sheet computers.

(Core Electrode (First Electrode))

Core electrode 8 of the nano-wire capacitor may be made from any electroconductive nano-wire or nano-tube of a material such as metals, highly doped semiconductors, and electroconductive oxides. A preferred one is silicon whisker. The electroconductivity of the silicon whisker can be increased by doping with phosphorus or boron.

The nano-wire has a diameter ranging preferably from several nanometers to hundreds of nanometers. Specifically, the diameter of the nano-wire ranges from 2 nm to 500 nm, preferably from 5 nm to 300 nm, more preferably from 5 nm to 50 nm.

The aspect ratio of the nano-wire is suitably selected for the use in the range from a rod shape to a wire shape. Specifically, the length ranges preferably from tens of nanometers to hundreds of micrometers. Specifically the length of the nano-wire ranges from 10 nm to 500 μm.

The nano-wire is produced preferably by growth on a substrate perpendicularly thereto for facilitating the subsequent operation of coverage with dielectric layer 9 or surface electrode 10. Specifically the process is selected preferably from gas phase processes such as CVD (chemical vapor deposition) and VLS (vapor-liquid-solid); and electrochemical processes such as electric field deposition.

(Dielectric Layer)

Dielectric layer 9 may be formed from any insulating material having preferably a higher dielectric constant and a lower electroconductivity. The material includes inorganic oxides and nitrides such as silicon oxide, silicon nitride, aluminum oxide, titanium oxide, and tantalum oxide; and organic polymers such as polyacrylates, polymethacrylates, polyethylene terephthalate, polyimides, polyethers, and siloxane-containing polymers. The process of formation of dielectric layer 9 is not limited: the dielectric layer may be formed on the peripheral face of the core electrode by a gas-phase process such as vapor deposition and sputtering, or a liquid-phase process.

The thickness of dielectric layer 9 ranges preferably from about one nanometer to tens of nanometers, but is not limited thereto.

Second Electrode

Surface electrode (second electrode) 10 may be formed from any electroconductive material: the material includes metals, highly doped semiconductors, and electro-conducting oxides. The process of formation of surface electrode 10 is not limited. The surface electrode may be formed on the peripheral face of the core electrode by a gas-phase process such as vapor deposition and sputtering, or a liquid-phase process. The thickness of surface electrode 10 ranges preferably from about one nanometer to tens of nanometers, but is not limited thereto. In this embodiment, the resistivity ($\Omega$m) of first electrode 1 or second electrode 2 is not higher than $10^{-4}$, preferably not higher than $10^{-5}$, more preferably not higher than $10^{-6}$.

(Process for Formation of Nano-Wire Capacitor).

The aforementioned nano-wire capacitor can be formed, for example as shown in FIGS. 4A-4D, through steps of formation of core electrodes 8, dielectric layers 9, and surface electrode 10, and a subsequent step of etching of dielectric layers 9 and surface electrodes 10.

Figure 4A:
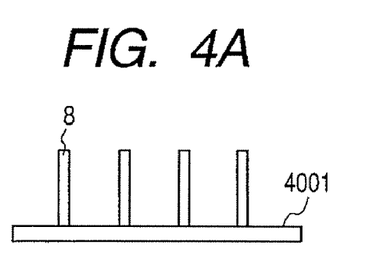
FIGS. 4A, 4B, 4C, and 4D show a process for producing the nano-wire capacitor in the present invention.
Figure 4B:
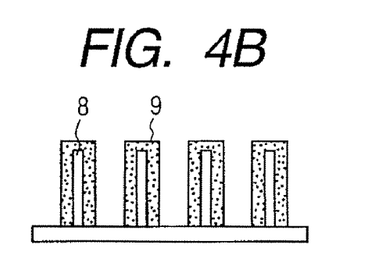
Figure 4C:
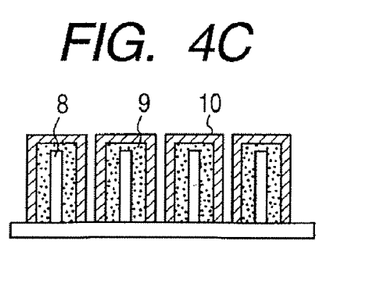
Figure 4D:
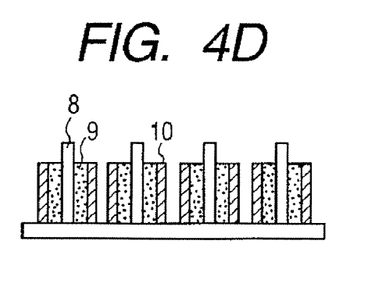

The process is explained specifically by reference to FIGS. 4A to 4D. Firstly on substrate 4001, electroconductive nano-wires 8 are formed to be roughly perpendicular to the substrate face (FIG. 4A). The peripheral faces of nano-wires 8 are covered with dielectric layer 9 (FIG. 4B). The peripheral faces of dielectric layers 9 are covered with electrode layer 10 (FIG. 4C). Then, the dielectric layers are partly removed to bare the tip portions of the nano-wires (FIG. 4D). If necessary, the nano-wires are separated from the substrate.

Figure 5A:
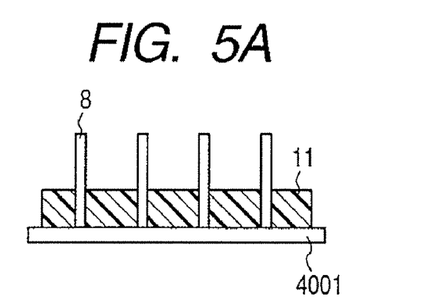
FIGS. 5A, 5B, 5C and 5D show another process for producing the nano-wire capacitor in the present invention.
Figure 5B:
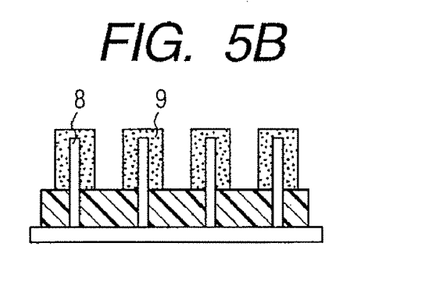
Figure 5C:
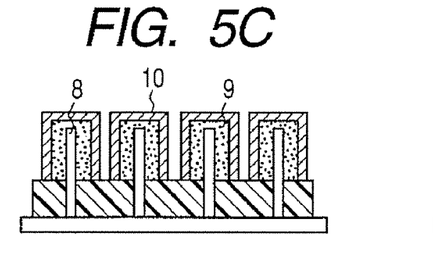
Figure 5D:
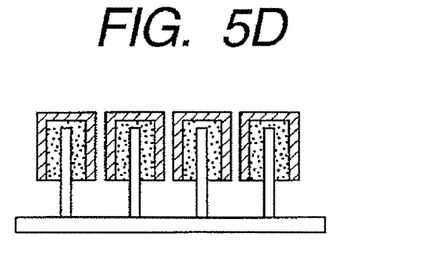

In another process, the capacitor can be produced through the steps shown in FIGS. 5A-5D. Specifically a member is provided which has substrate 4001, porous layer 11 having pores perpendicular to the substrate face, and electroconductive nano-wires 8 extending through the pores of the porous layer outward to be longer than the thickness of the porous layer (FIG. 5A). Then dielectric layer 9 is formed to cover nano-wires 8 (FIG. 5B). Surface electrodes 10 are formed thereon (FIG. 5C). Finally, porous layer 11 is removed (FIG. 5D). The material of the porous layer includes a porous material containing anodized alumina (Japanese Patent Application Laid-Open No. 2000-031462), and porous silicon or silicon oxide (Japanese Patent Application Laid-Open No. 2004-237430). The nano-wire can be grown by a VLS process or a like process with catalyst fine particles (Au or the like) placed on the bottoms of the pores of the porous layer.

The nano-wire capacitor has a core electrode bared preferably only at one end as shown in FIGS. 3A and 3B for a larger charge-storage capacity of the capacitor. Otherwise, the nano-wire capacitor in this embodiment may have the core electrode bared at the both ends, or bared at the middle portion thereof, although not shown in the drawing, to be suitable for the use.

Figure 7:
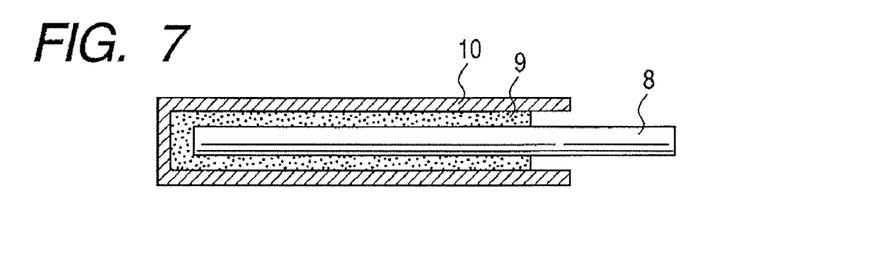
FIG. 7 is a sectional view of another nano-wire capacitor employed in the present invention.

The bared portion of the core electrode, other than that shown in FIGS. 3A and 3B, may take various shapes. The bared end portion may be stepped as shown in FIGS. 6 and 7. In FIG. 6, dielectric layer 2 is bared, while in FIG. 7, the dielectric layer retracts not to be exposed. The face of the other end of core electrode 8 opposite to the bared end portion may be exposed as shown in FIG. 8.

Figure 9:
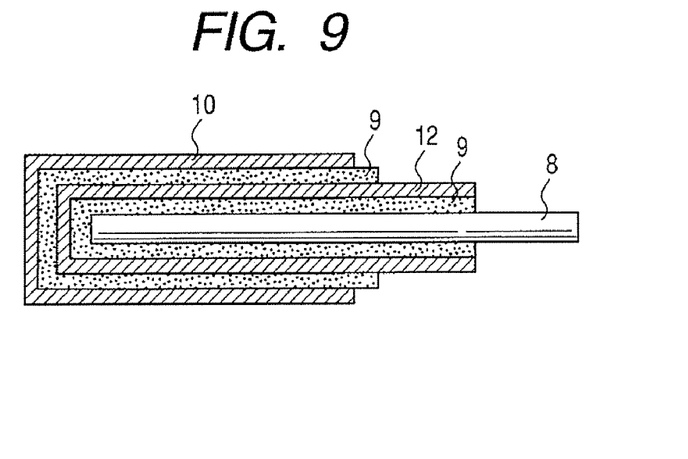
FIG. 9 is a sectional view of still another nano-wire capacitor employed in the present invention.
Figure 10:
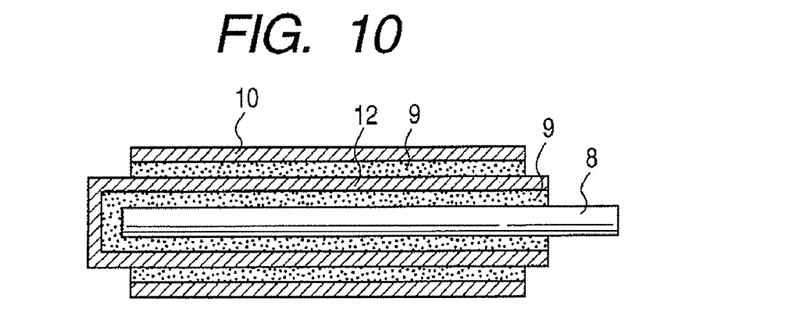
FIG. 10 is a sectional view of still another nano-wire capacitor employed in the present invention.

The nano-wire capacitor in the present invention may be made in a lamination structure by providing internal electrode 12 as shown in FIG. 9 or FIG. 10 to increase the capacitance. In FIGS. 9 and 10, one dielectric layer and one internal electrode are additionally provided, whereas two or more respectively of the internal electrodes and the dielectric layers may be laminated alternately. With the constitution shown in FIGS. 9 and 10, internal electrode 12 may be employed as one electrode of the capacitor and core electrode 8 and surface electrode 10 may be connected outside to serve as the other electrode of the capacitor for higher capacitance. In another capacitor, as shown in FIGS. 21 and 22, internal electrode 12 is employed as one electrode and core electrode 8 and surface electrode 10 are connected inside to serve, as the other electrode of the capacitor. Otherwise, with a constitution in which two or more respectively of the internal electrodes and the dielectric layers are laminated alternately, odd internal electrode layers are commonly connected as one electrode of the capacitor and the core electrode and even internal electrode layers are commonly connected as the other electrode of the capacitor to obtain higher capacitance. The common connection may be made outside as shown in FIGS. 9 and 10, or may be made inside the element as shown in FIGS. 21 and 22.

Figure 11:
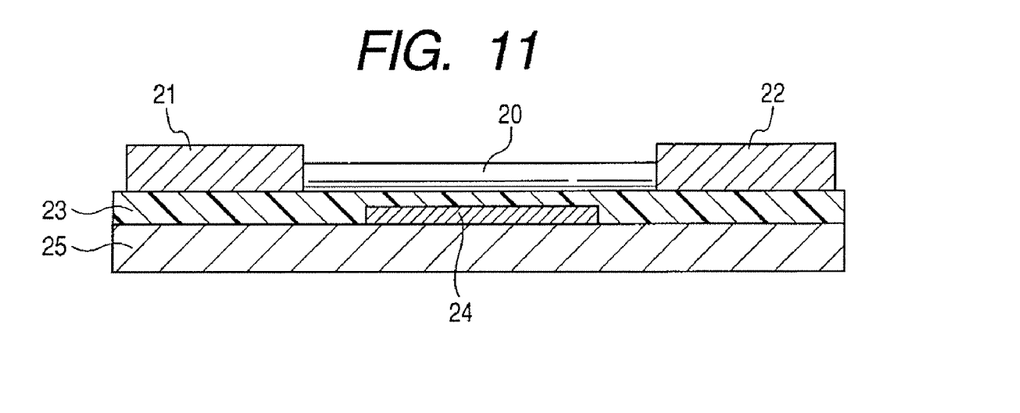
FIG. 11 is a sectional view of a semiconductor nano-wire transistor.

Semiconductor nano-wire transistor 2 comprises comprised of semiconductor nano-wire 20, source electrode 21, drain electrode 22, gate-insulating layer 23, gate electrode 24, and substrate 25 as shown in FIG. 11.

The material for semiconductor nano-wire 20 of semiconductor nano-wire transistor 2 includes compound semiconductors such as II-IV group compound semiconductors, III-V group compound semiconductors, I-V group compound semiconductors, I-VI group compound semiconductors, I-VII group compound semiconductors, II-V group compound semiconductors, II-VII group compound semiconductors, III-VI group compound semiconductors, and IV-IV group compound semiconductors; and VI group semiconductors. Specific examples of the material includes Si, Ge, SiGe, AlGaAs, ZnO, ZnS, ZnSe, ZnTe, CdS, CdSe, CdTe, GaAs, GaN, GaAs, GaP, InP, InN, InAs, and carbon nano-tubes. The semiconductor nano-wire is preferably synthesized by a CVD process or a VLS process, but is not limited thereto. Among the processes, the VLS process is preferred in view of the narrow diameter distribution and uniform length of the resulting nano-wires.

Source electrode 21, drain electrode 22, and gate electrode 24 may be formed from any electroconductive material without limitation, the material including metals such as platinum, gold, silver, nickel, chromium, copper, iron, tin, antimony, lead, tantalum, indium, aluminum, zinc, and magnesium, and alloys thereof; electroconductive metal oxides such as indium-tin oxide; inorganic and organic semiconductors having electroconductivity increased by doping or a like method such as silicon single crystal, polysilicon, amorphous silicon, germanium, graphite, polyacethylene, polyparaphenylene, polythiophene, polypyrrole, polyaniline, polythienylenevinylene, and polyparaphenylene-vinylene. The respective electrodes may be prepared by sputtering, vapor deposition, printing with a solution or a paste, ink-jet printing, or a like method.

Gate-insulating layer 23 may be formed from any insulating material having preferably a higher dielectric constant and a lower electroconductivity. The material includes inorganic oxides and nitrides such as silicon oxide, silicon nitride, aluminum oxide, titanium oxide, and tantalum oxide; and organic polymers such as polyacrylates, polymethacrylates, polyethylene terephthalate, polyimides, polyethers, and siloxane-containing polymers. The above insulating material preferably has high surface smoothness.

Substrate 25 may be made of any material without limitation, the material including glass, ceramics, semiconductors, metals, and plastics. Of these materials, glass and plastics are preferred in view of the low cost. The transistor can be made flexible by use of a plastic substrate, enabling flexible display apparatus and various flexible devices.

Figure 12:
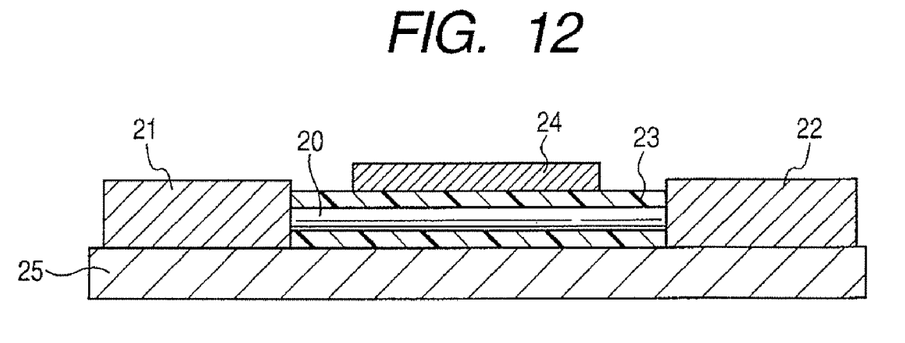
FIG. 12 is a sectional view of another semiconductor nano-wire transistor.
Figure 13:
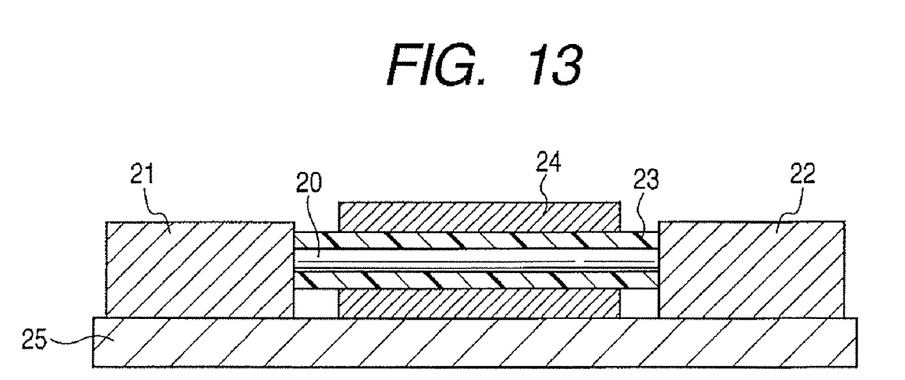
FIG. 13 is a sectional view of still another semiconductor nano-wire transistor.

The aforementioned nano-wire transistor may have a constitution, other than the one shown in FIG. 11, in which the peripheral face of semiconductor nano-wire 20 is covered with gate-insulating layer 23 as shown in FIG. 12. Otherwise, the peripheral face of gate-insulating layer 23 is further covered by gate electrode 24 as shown in FIG. 13. For formation of this structure, the peripheral face of the semiconductor nano-wire is covered with the insulating layer, or the insulating layer and the gate electrode layer; the covered nano-wire is placed at a prescribed position; the insulating layer or the insulating layer and gate-electrode layer at the end portions is removed by use of a mask exposing the end portions; and then the source electrode and the drain electrode are formed on the end portions. Otherwise, both ends of the semiconductor nano-wire may be bared by combination of the processes shown in FIGS. 4 and 5.

In the circuit device of this embodiment, the length direction of the semiconductor nano-wire for electroconductive channel of the field effect transistor (first length direction), and the length direction of the nano-wire capacitors as the capacitor (second length direction) are preferably oriented in the same direction. Because in placing nano-wires on the substrate of the circuit, the nano-wires of the elements, which are oriented commonly in the same direction, can be formed in one process. When the first length direction and the second length direction are crossed, the arrangement of the wires becomes complicated. In particular in the case where plural TFTs (utilizing a nano-wire as the channel) and at least one nano-wire capacitor are employed for respective picture element regions of the image display apparatus, uniformity is preferable of the length directions of the nano-wire channels and the nano-wire capacitor in the respective picture element regions. However, the present invention includes not only the cases in which the two length directions are parallel to each other but also the cases in which the two directions are substantially parallel and the cases in which the two directions are crossing.

The circuit device of this embodiment is preferably formed by providing a substrate having wirings for electrodes and gate-insulating layer and so forth formed preliminarily, and applying thereon a solution containing semiconductor nano-wires 20 dispersed therein and a solution containing capacitor 1 dispersed therein. With this method of formation, semiconductor nano-wire transistors and nano-wire capacitors can be formed on a desired substrate to provide a circuit device having a large area at a low cost. Further, the elements can be formed on a flexible substrate like a plastic substrate to provide a novel shape of circuit device such as a flexible display apparatus and a sheet computer.

Figure 20:
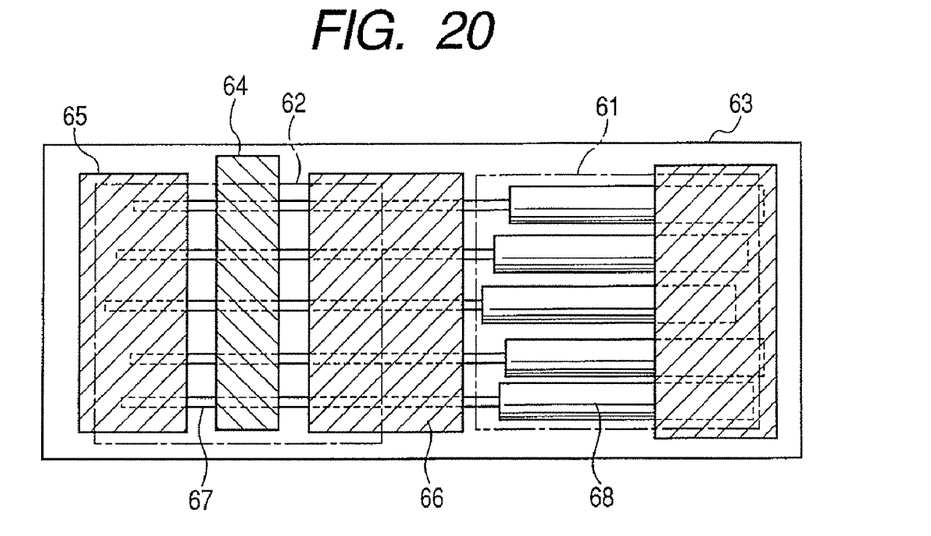
FIG. 20 illustrates an electric element of the present invention.

The electric element of this embodiment may be formed in a constitution in which a transistor and a capacitor are formed on one and the same nano-wire as shown in FIG. 20 as an example. With such a constitution, transistors and capacitors are collectively formed on an element, enabling production of an electric element in a simple constitution through a simple production process. In this constitution, the composition of the nano-wire may be changed between the transistor portion and the capacitor portion, wherein the electro-conductivity is made higher at the portion corresponding to the capacitor core electrode than at the portion corresponding to the transistor channel. In a specific example, a semiconductor nano-wire as the above nano-wire is doped less at the transistor portion and doped more at the capacitor portion.

The circuit device and electric element of the present invention give high mobility of the semiconductor nano-wire transistor and high capacitance of the nano-wire capacitor on one desired substrate. Thereby, circuit devices and electric elements of a large area are provided at a low cost. A high density of the electronic circuit can be obtained which cannot be achieved by a conventional light exposure technique.

The circuit device and electric element having the nano-wire capacitor and the semiconductor nano-wire transistor is exemplified by an active matrix-drive display apparatus, and a DRAM (Dynamic Random-Access Memory).

In constructing the display apparatus according to the present invention, the circuit devices and electric elements of this embodiment can be formed into a high-performance circuit on a desired substrate, facilitating formation of flexible display apparatus, increase of the display area, and low cost. In particular, the semiconductor nano-wire transistor, which has a high mobility, is effective for an organic EL display element, enabling production of large screen of the organic EL display apparatus according to the present invention. Thereby a sheet-shaped large-area display can be provided which has not been achieved by a conventional technique.

In constructing a DRAM with the circuit devices and electric elements of this embodiment of the present invention, the electronic circuit can be formed in a higher density with a higher capacitance than that formed by conventional light exposure process. Further, since the electronic circuit according to the present invention can be formed on any desired substrate, a sheet-shaped large-area DRAM can be produced at a low cost. In other words, the circuit device and the electric element of the present invention enables production of a DRAM of a larger capacity by synergistic effect of a higher density and a larger area of the elements.

An application of the circuit device of this embodiment of the present invention to a picture element circuit of an active-matrix-drive type display apparatus is explained below in detail. In the picture element explained below, the electric element shown in FIG. 20 is naturally useful for the picture element circuit explained below.

(1) Application to Current-Drive Type Display Apparatus

In driving a current-drive type display apparatus like an organic EL system and an inorganic LED system, electric current is kept to flow through the picture element during one frame period and the driving transistor is kept turned on by a transistor and a capacitor for switching. Therefore, for the driving, the current-drive type display apparatus has a capacitor and at least two transistors in respective picture elements: a switching transistor for writing a current in a capacitor of a picture element, and a driving transistor for supplying electric current to a display element such as an organic EL element and an inorganic LED element.

Figure 14A:
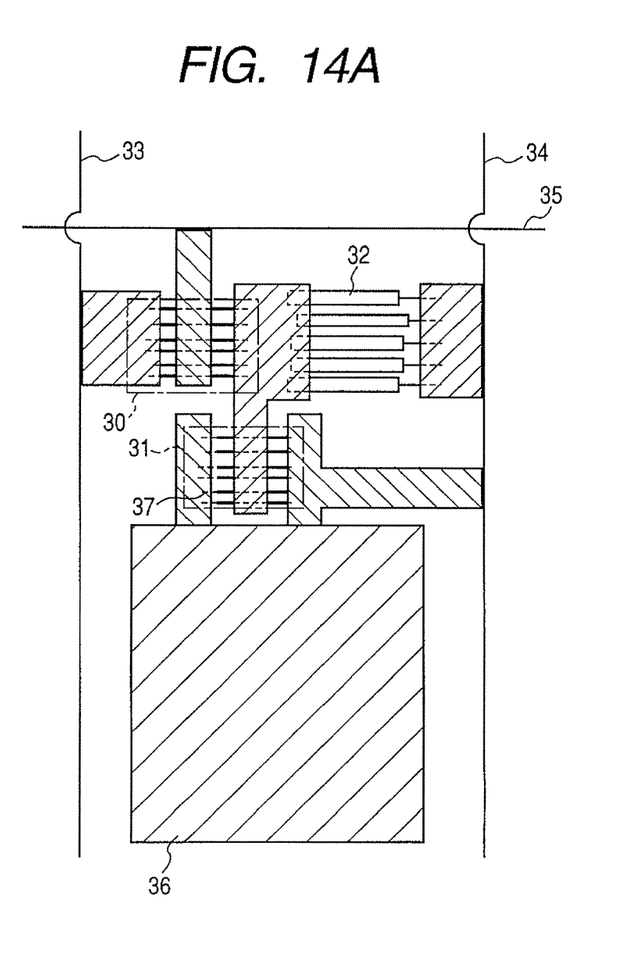
FIGS. 14A and 14B illustrate a circuit device of the present invention employed in a current-drive type of display apparatus.
Figure 14B:
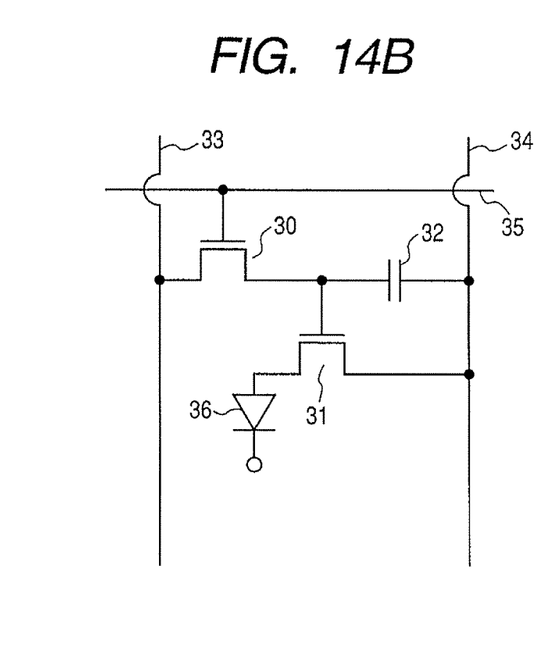
Figure 15:
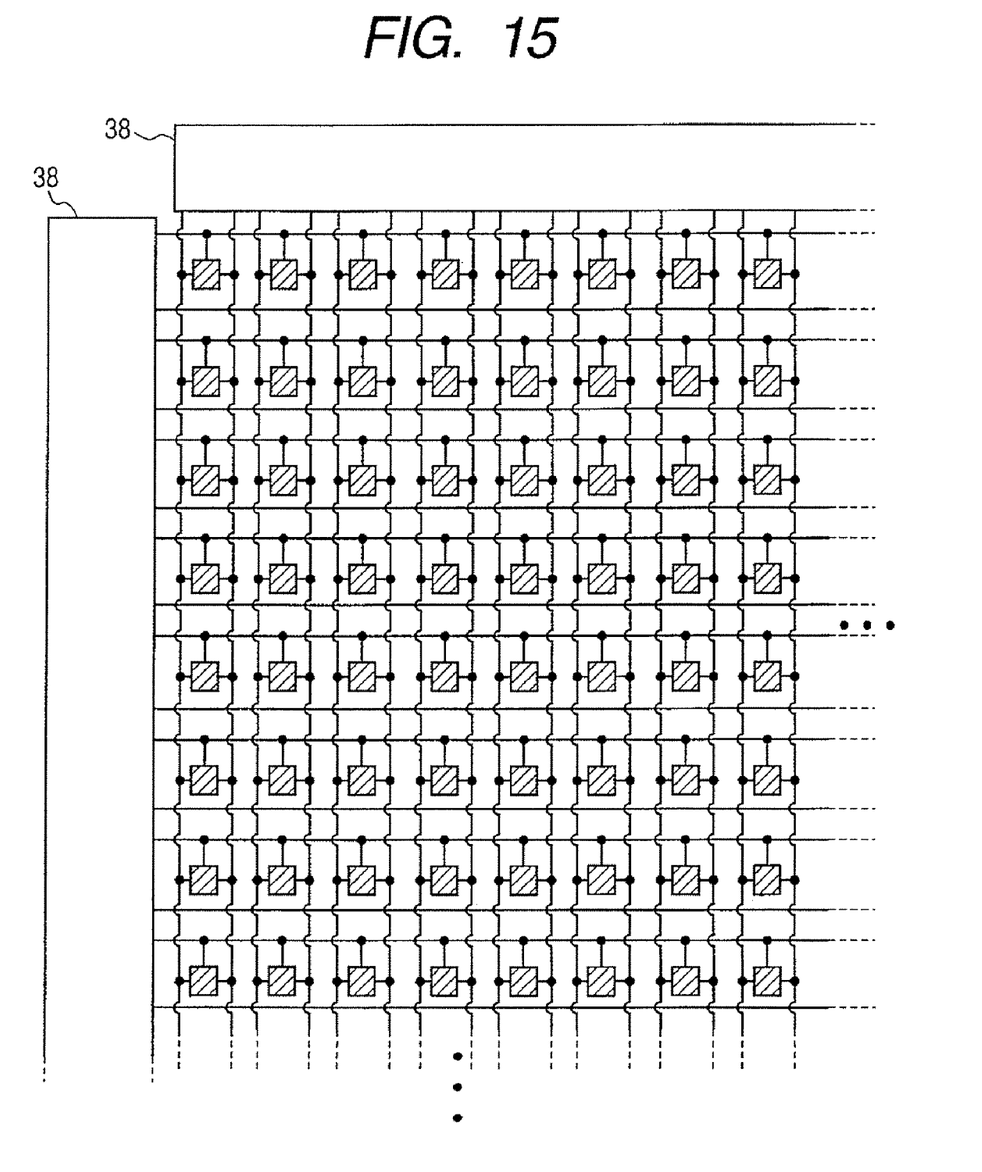
FIG. 15 illustrates the circuit devices of the present invention employed in a current-drive type of display apparatus.

FIGS. 14A and 14B and 15 illustrate an example of the current-drive type display apparatus according to the present invention. FIG. 14A is an enlarged view of one picture element FIG. 14B is a circuit diagram of the view of FIG. 14A. FIG. 15 shows an arrangement of plural picture elements. In FIG. 15, the respective picture elements are shown simply as a block.

The element of the above-mentioned current-drive type display apparatus comprises nano-wire transistor 30 for switching, nano-wire transistor 31 for driving, nano-wire capacitor 32, data line 33, power-supplying line 34, scanning line 35, display part 36, and driving circuit 38. Display part 36 is an EL, element. Driving nano-wire transistor 31 and switching nano-wire transistor 30 have respectively plural semiconductor nano-wires 37. Switching nano-wire transistor 30 and driving nano-wire transistor 31 have respectively a plurality of the aforementioned semiconductor nano-wires.

Since driving nano-wire transistor 31 should allow a larger amount of electric current to flow through display part 36, driving nano-wire transistor 31 preferably incorporates a larger number of the semiconductor nano-wires 37. Therefore, semiconductor nano-wires are preferably incorporated in a larger number in driving nano-wire transistor 31 than in the switching nano-wire transistor 30. The TFT is preferably passivated in order to prevent exfoliation of the semiconductor nano-wire and the nano-wire capacitor from the substrate.

In the process for producing the above display apparatus, semiconductor nano-wire 37 and nano-wire capacitor 32 are applied in a state of solvent dispersion. Such a process enables formation of transistors and capacitors, without employing a vacuum process, an a desired substrate at a lower cost of the display apparatus. A flexible display apparatus can be produced by use of a plastic substrate. In particular, the present invention enables a high mobility and a large area of a picture element circuit, enabling also production of a large-area organic EL display apparatus which has not been achieved by conventional techniques.

(2) Application to Voltage-Drive Type Display Apparatus

In voltage-drive type display method employed in liquid crystal display apparatuses, electrophoresis type display apparatuses, and so forth, since the display portion is controlled only by turning-on and turning-off of the voltage, only one transistor is enough for one picture element, being different from the aforementioned current-drive type display apparatus. For giving a memory capacity, a capacitor is provided in each picture element similarly as in the aforementioned current-drive type display apparatus.

Figure 16A:
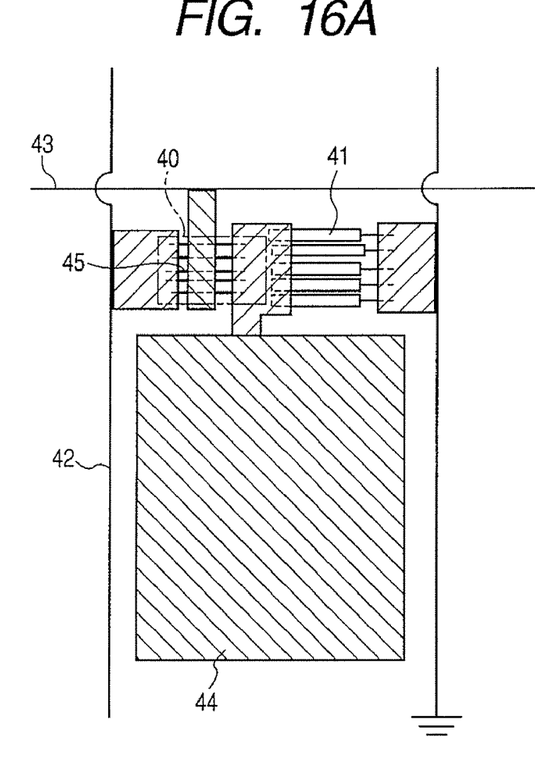
FIGS. 16A and 16B illustrates a circuit device of the present invention employed in a voltage-drive type of display apparatus.
Figure 16B:
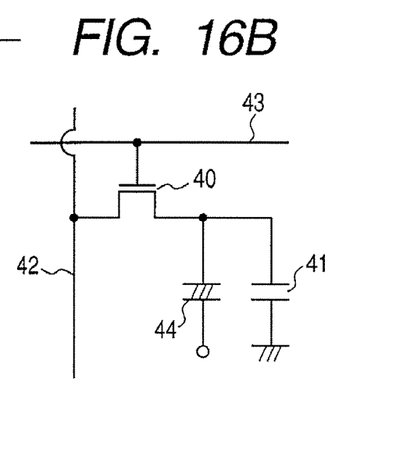

FIG. 16A shows a constitution of one picture element of a voltage-drive type display apparatus employing a nano-wire capacitor of the present invention. FIG. 16B is a circuit diagram of the picture element of FIG. 16A. The voltage-drive type display apparatus comprises, in a picture element, driving nano-wire transistor 40, nano-wire capacitor 41, data line 42, scanning line 43, display portion 44. Display portion 44 is a liquid crystal element which is comprised of a picture element electrode, a counter electrode, and a liquid crystal layer held between the electrodes. In FIG. 16, display portion 44 shows the picture element electrode. Driving nano-wire transistor 40 has semiconductor nano-wire 45.

Driving nano-wire transistor 40 is a field effect transistor employing a semiconductor nano-wire as the channel, having the same constitution as the nano-wire transistor of the aforementioned current-drive type display apparatus. FIGS. 16A and 16B shows one picture element. A display apparatus is comprised by arranging a plurality of the picture elements and connecting thereto driving circuits similarly as in FIG. 15. This display apparatus, similarly as the current-drive type display apparatus, is preferably passivated to prevent exfoliation of the semiconductor nano-wire and the nano-wire capacitor from the substrate.

In the process for production of the above-mentioned display apparatus, similarly as in production of the aforementioned current-drive type display apparatus, a transistor and a capacitor can be formed on a desired substrate without a vacuum process. Therefore such a process reduces the production cost of the display apparatus. The display apparatus can be made flexible by use of a plastic substrate. The voltage-drive type TFTs are simpler than current-drive type TFTs in the circuit constitution and production process.

Figure 17A:
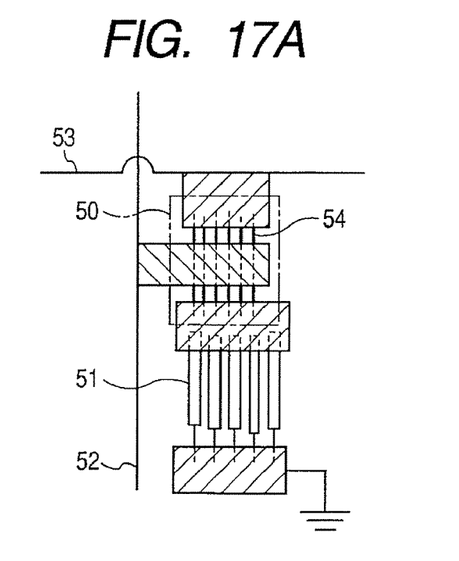
FIGS. 17A and 17B illustrate a circuit device of the present invention employed in a DRAM.
Figure 17B:
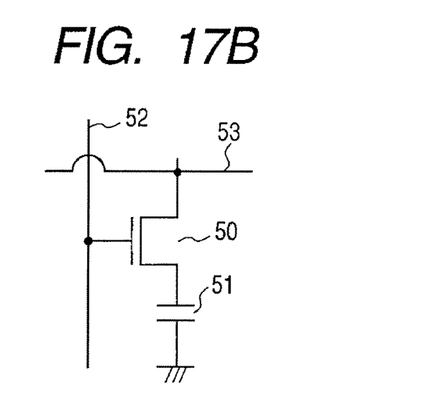
Figure 18:
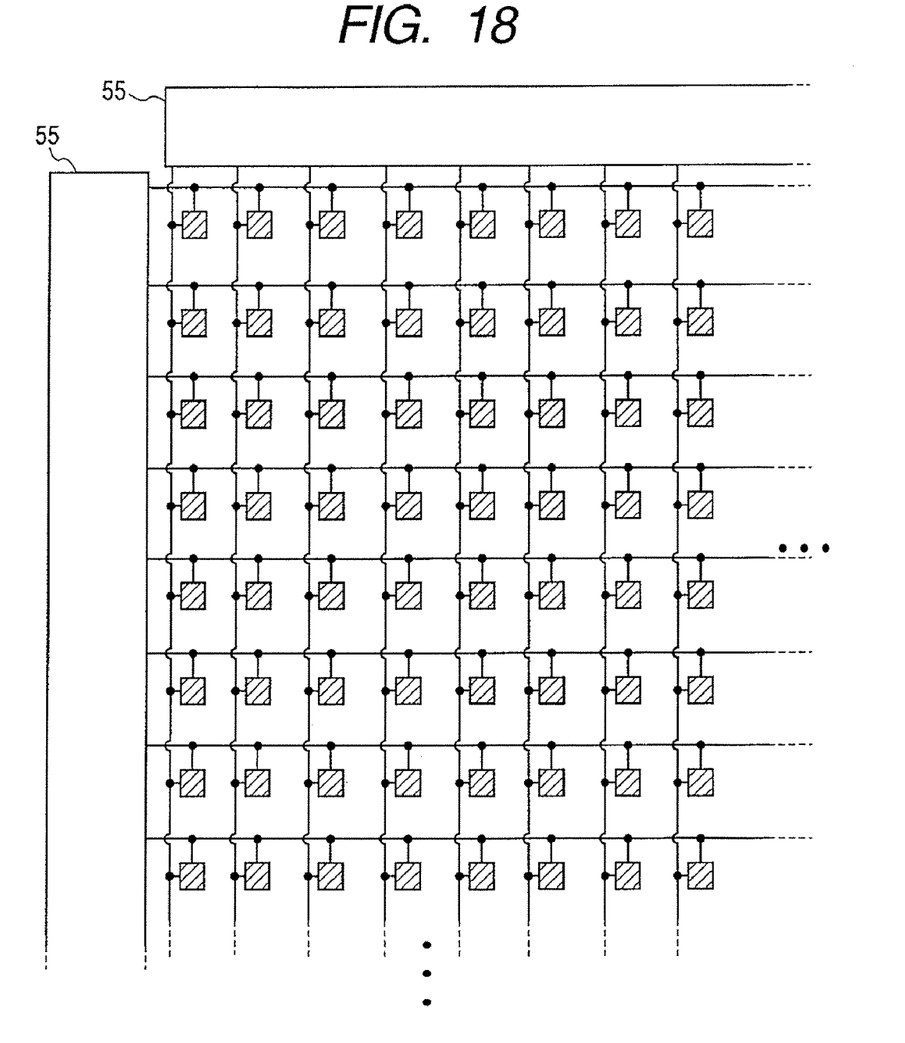
FIG. 18 illustrates circuit devices of the present invention employed in a DRAM.

Application of a nano-wire capacitor typified by this embodiment of the present invention to DRAM is explained below in detail. Naturally the electric element shown in FIG. 20 is useful in the cell described below. DRAM is a memory element arrangement having transistors and capacitors for storing electric charge. FIGS. 17A and 17B and FIG. 18 show an example of a DRAM employing semi-conductor nano-wire transistors and nano-wire capacitors. FIG. 17A is an enlarged view of one cell of the DRAM. FIG. 17B is a circuit diagram of the view of FIG. 17A. FIG. 18 shows arrangement of the cells. In FIG. 18, respective cells are represented simply by a block.

The DRAM element comprises semiconductor nano-wire transistor 50, nano-wire capacitor 51, word line 52, bit line 53, and driving circuit 55. Semiconductor nano-wire transistor 50 has semiconductor nano-wire 54. The DRAM stores data by storing electric charge in the capacitor of the respective cells through the word lines and the bit lines. Semiconductor nano-wire transistor 50 may be the same as the one employed in the aforementioned display apparatus.

The semiconductor nano-wire and nano-wire capacitor of the DRAM are preferably passivated for prevention of exfoliation from the substrate.

The semiconductor nano-wire and nano-wire capacitor of the DRAM have diameters of not larger than tens of nanometers. Therefore, the density of the circuit can be increased for higher memory capacity in comparison with a DRAM produced by a conventional light-exposure process. Further, the coating step in the DRAM production process enables formation of transistors and capacitors without employing a vacuum process on a desired substrate. Therefore, the cost of the DRAM can be reduced and the elements can be formed in a large area. Thereby, a DARM having a large capacitance which has not been achieved can be produced owing to the large element area and high density of the elements. A flexible DRAM can be produced by use of a plastic substrate for new application of the resent invention such as a sheet computer.

In the present invention, the transistor and the nano-wire capacitor can be formed by application of a solvent dispersion of the semiconductor nano-wire and the nano-wire capacitor onto a desired substrate to form the element. Therefore, the element can be formed in a large area at a low cost. The substrate can be made flexible by formation on a plastic substrate.

EXAMPLES

Example 1

An organic EL display apparatus is produced with nano-wire capacitors and semiconductor nano-wire FETs.

Firstly, a nano-wire capacitor is prepared by using a highly doped Si nano-wire as the core electrode, silica as the dielectric layer, and Au as the surface electrode. The Si nano-wire is formed by a VLS process, and doped with B as the dopant.

The Si nano-wire is prepared through steps below. On a Si substrate, fine gold particles of 15-20 nm diameter are deposited. This substrate is heated in an atmosphere of $SiH_4$ and $B_2H_6$ at 450° C. to allow nano-wires to grow. The formed nano-wires contain B as a dopant at a content of 0.5% mol, and have a diameter of about 15-20 nm, and a length of 30-50 μm. The resulting Si nano-wire is oxidized on the surface to form a silica coating film. Thereon, Au surface electrode is formed by vapor deposition to form a capacitor. The end portion of the core electrode is bared by dry etching to obtain the nano-wire capacitor.

The obtained nano-wire capacitors are ultrasonically separated from the substrate and are dispersed in solvent ethanol.

Separately, the semiconductor nano-wire for the semiconductor nano-wire FET is prepared by a VLS process in a similar manner as in preparation of the above core electrodes. The prepared Si nano-wires contain B at a content of 0.01% mol. The surface of the nano-wires is oxidized to form gate-insulating layers. The semiconductor nano-wires are separated ultrasonically from the substrate and dispersed in solvent ethanol in the same manner as the above nano-wire capacitors.

The display apparatus of this Example has a constitution shown in FIGS. 14 and 15, comprising switching nano-wire transistors, driving nano-wire transistors, nano-wire capacitors, data lines, power supply lines, scanning lines, organic EL elements as display elements, and driving circuits.

In production of the display apparatus, firstly, wirings of data lines, power supply lines, scanning lines, and so forth are formed by vapor deposition of Au, Then semiconductor nano-wires for the switching nano-wire transistors and for driving nano-wire transistors are formed by coating application, and are passivated with a UV-setting resin to prevent exfoliation from the substrate to form transistors. Then the above nano-wire capacitors are applied and arranged by coating application on the TFTs, and the nano-wire capacitors are passivated with a UV-setting resin to complete the capacitors on the TFTs.

In the formation of the organic EL element, a positive electrode is formed from ITO, a positive hole-transporting layer is formed from PEDOT/PSS, a light-emitting layer is formed from poly[2-methoxy-5-(2'-ethyl-hexyloxy)-1,4-phenylene-vinylene] (MEH-PPV), and the negative electrode is formed from Ca/Al. The positive hole-transporting layer, and the light-emitting layer are patterned by an ink-jet method, the ITO is formed by sputtering, and the Ca/Al is formed by vapor deposition.

Finally, driving circuits are connected to the elements to complete the display apparatus.

The organic EL element formed by the above process achieves high efficiency owing to the high mobility of the nano-wire transistor, enabling a larger electric current to flow through the elements. Further, the organic EL element display apparatus having a large screen can be produced at a low cost since the transistors and the capacitors can be formed without a vacuum process owing to the capacitors employing nano-wires.

Example 2

A DRAM is produced with the nano-wire capacitors and semiconductor nano-wire FETs which are prepared in Example 1. The nano-wire capacitors prepared in Example 1 are separated from the substrate by ultrasonic wave and are dispersed in solvent ethanol.

On the other hand, the semiconductor nano-wire for the semiconductor FET is prepared by a VLS process in a similar manner as in preparation of the core electrode in Example 1. The resulting nano-wire is composed of Si containing B at a content of 0.01% mol. The surface of the nano-wire is oxidized to form a gate-insulating layer. The semiconductor nano-wires are separated from the substrate ultrasonically and dispersed in solvent ethanol in the same manner as the above nano-wire capacitors.

The DRAM of this Example has a constitution shown in FIGS. 17A and 17B and 18, comprising semiconductor nano-wire transistors, nano-wire capacitors, word lines, bit lines and driving circuits. In production of the DRAM, firstly, wirings of word lines, bit lines, and so forth are formed by vapor deposition of Au. Then the semiconductor nano-wires for the semiconductor nano-wire transistors are formed by coating application. The wirings are passivated with a UV-setting resin to prevent exfoliation from the substrate to form transistors. Then the above nano-wire capacitors are applied and arranged by coating on the TFTs in a similar manner as the above semiconductor nano-wires, and the nano-wire capacitors are passivated with a UV-setting resin to form capacitors on the TFTs. Finally, driving circuits are connected thereto to complete a DRAM.

The DRAM of this Example employs semiconductor nano-wires and nano-wire capacitors of tens of nanometers in diameter, having a high memory capacity owing to the high density of the circuit in comparison with DRAMs produced by a conventional light exposure process.

In the production of the DRAM above, transistors and capacitors are formed on a substrate (a glass substrate in this Example) by coating without employing a vacuum process. Thereby the DRAM can be provided with a larger element area at a higher density at a lower cost. The DRAM enables a large capacity which has not been achieved.

INDUSTRIAL APPLICABILITY

The present invention is applicable to various circuit devices and electric elements having transistors and capacitors such as TFTs for active matrix drive display apparatus, and DRAM and the like semiconductor memories.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-352572, filed on Dec. 6, 2005 which is hereby incorporated by reference herein in its entirety.

What is claimed is:

1. A circuit device having a field effect transistor and a capacitor, wherein the capacitor is connected to at least one of a gate electrode, a source electrode and a drain electrode of the field effect transistor, the field effect transistor has a channel comprised of a nano-wire, the capacitor comprises a capacitor core electrode comprised of a first electrode, the first electrode comprised of the nano-wire, a dielectric layer partly covering a peripheral face of the first electrode and a second electrode covering a peripheral face of the dielectric layer, and the composition of the nano-wire is changed between the transistor portion and capacitor portion, wherein the electro-conductivity of the nano-wire is made higher at the portion corresponding to the capacitor core electrode than at the portion corresponding to the transistor channel, and a display element is connected to the source electrode or the drain electrode of the field effect transistor of the circuit device.

2. The circuit device according to claim 1, wherein the first electrode has a first end portion and a second end portion, and the dielectric layer covers the first end portion and the peripheral face of the first electrode between the first end portion and the second end portion, but not the second end portion.

3. The circuit device according to claim 1, wherein the peripheral face of the first electrode is covered with the dielectric layer and the second electrode one by one, or with dielectric layers and second electrodes alternately in lamination.

4. The circuit device according to claim 1 wherein one end portion of the first electrode is not covered with the dielectric layer and the second electrode is to be bared.

5. A circuit device having a field effect transistor and a capacitor, wherein the capacitor is connected to at least one of a gate electrode, a source electrode and a drain electrode of the field effect transistor, the field effect transistor has a channel comprised of a nano-wire, the capacitor comprises a capacitor core electrode comprised of a first electrode, the first electrode comprised of the nano-wire, a dielectric layer partly covering a peripheral face of the first electrode and a second electrode covering a peripheral face of the dielectric layer, and the composition of the nano-wire is changed between the transistor portion and capacitor portion, wherein the electro-conductivity of the nano-wire is made higher at the portion corresponding to the capacitor core electrode than at the portion corresponding to the transistor channel, and an organic light-emitting display element is connected to the source electrode or the drain electrode of the field effect transistor of the circuit device.

6. The circuit device according to claim 5, wherein the first electrode has a first end portion and a second end portion, and the dielectric layer covers the first end portion and the peripheral face of the first electrode between the first end portion and the second end portion, but not the second end portion.

7. The circuit device according to claim 5, wherein the peripheral face of the first electrode is covered with the dielectric layer and the second electrode one by one, or with dielectric layers and second electrodes alternately in lamination.

8. The circuit device according to claim 5 wherein one end portion of the first electrode is not covered with the dielectric layer and the second electrode is to be bared.

9. A circuit device having a field effect transistor and a capacitor, wherein the capacitor is connected to at least one of a gate electrode, a source electrode and a drain electrode of the field effect transistor, the field effect transistor has a channel comprised of a nano-wire, the capacitor comprises a capacitor core electrode comprised of a first electrode, the first electrode comprised of the nano-wire, a dielectric layer covering a peripheral face of the first electrode and a second electrode covering a peripheral face of the dielectric layer, and the composition of the nano-wire is changed between the transistor portion and capacitor portion, wherein the electro-conductivity of the nano-wire is made higher at the portion corresponding to the capacitor core electrode than at the portion corresponding to the transistor channel, and a display element is connected to the source electrode or the drain electrode of the field effect transistor of the circuit device.

* * * * *